(12) United States Patent
Fernando et al.

(10) Patent No.: US 9,355,995 B2
(45) Date of Patent: May 31, 2016

(54) SEMICONDUCTOR PACKAGES UTILIZING LEADFRAME PANELS WITH GROOVES IN CONNECTING BARS

(71) Applicant: International Rectifier Corporation, El Segundo, CA (US)

(72) Inventors: Dean Fernando, Torrance, CA (US); Roel Barbosa, Sta. Rosa Laguna (PH)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/152,816

(22) Filed: Jan. 10, 2014

(65) Prior Publication Data
US 2014/0127861 A1     May 8, 2014

Related U.S. Application Data

(63) Continuation-in-part of application No. 13/662,244, filed on Oct. 26, 2012, which is a continuation of application No. 13/034,519, filed on Feb. 24, 2011, now Pat. No. 8,587,101.

(60) Provisional application No. 61/782,460, filed on Mar. 14, 2013, provisional application No. 61/459,527, filed on Dec. 13, 2010.

(51) Int. Cl.
*H01L 21/00*     (2006.01)
*H01L 23/00*     (2006.01)
(Continued)

(52) U.S. Cl.
CPC ............ *H01L 24/97* (2013.01); *H01L 23/4952* (2013.01); *H01L 23/49513* (2013.01); *H01L 23/49541* (2013.01); *H01L 23/49548* (2013.01); *H01L 23/49562* (2013.01);
(Continued)

(58) Field of Classification Search
USPC .......................... 257/659, 660; 438/112, 111
See application file for complete search history.

(56) References Cited

U.S. PATENT DOCUMENTS 5,773,883 A     6/1998   Majumdar
5,998,856 A    12/1999   Noda
(Continued)

FOREIGN PATENT DOCUMENTS

EP     2 463 904      6/2012
JP     H 9-102580     4/1997
(Continued)

OTHER PUBLICATIONS

U.S. Appl. No. 61/459,527, filed Dec. 13, 2010, Fernando.
(Continued)

*Primary Examiner* — Errol Fernandes
(74) *Attorney, Agent, or Firm* — Farjami & Farjami LLP (57) ABSTRACT

According to an exemplary implementation, a method includes utilizing a leadframe panel comprising a plurality of leadframe modules, each of the plurality of leadframe modules having a leadframe pad. The leadframe panel has a plurality of bars each having a plurality of grooves, where the plurality of bars connect the plurality of leadframe modules. The method further includes attaching a device to the leadframe pad. The method also includes molding the leadframe panel while leaving a bottom of the leadframe pad exposed. Furthermore, the method includes sawing through the plurality of grooves of the plurality of bars to singulate the plurality of leadframe modules into separate packaged modules.

19 Claims, 8 Drawing Sheets

(51) Int. Cl.
*H01L 23/495* (2006.01)
*H01L 23/31* (2006.01)

(52) U.S. Cl.
CPC ......... *H01L 23/49575* (2013.01); *H01L 24/85* (2013.01); *H01L 23/3107* (2013.01); *H01L 24/29* (2013.01); *H01L 24/32* (2013.01); *H01L 24/45* (2013.01); *H01L 24/48* (2013.01); *H01L 24/49* (2013.01); *H01L 2224/2929* (2013.01); *H01L 2224/29339* (2013.01); *H01L 2224/32245* (2013.01); *H01L 2224/45015* (2013.01); *H01L 2224/45144* (2013.01); *H01L 2224/45147* (2013.01); *H01L 2224/48091* (2013.01); *H01L 2224/48247* (2013.01); *H01L 2224/49171* (2013.01); *H01L 2224/73265* (2013.01); *H01L 2224/83439* (2013.01); *H01L 2224/85005* (2013.01); *H01L 2224/97* (2013.01); *H01L 2924/014* (2013.01); *H01L 2924/0105* (2013.01); *H01L 2924/01005* (2013.01); *H01L 2924/01006* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/0781* (2013.01); *H01L 2924/1305* (2013.01); *H01L 2924/1306* (2013.01); *H01L 2924/13055* (2013.01); *H01L 2924/13064* (2013.01); *H01L 2924/13091* (2013.01)

(56) References Cited

U.S. PATENT DOCUMENTS

| | | | |
|---|---|---|---|
| 6,137,165 A | 10/2000 | Thierry | |
| 6,211,549 B1 | 4/2001 | Funaki | |
| 6,249,024 B1 | 6/2001 | Mangtani | |
| 6,313,598 B1 | 11/2001 | Tamba | |
| 6,465,875 B2 | 10/2002 | Connah | |
| 6,610,923 B1* | 8/2003 | Nagashima et al. | 174/537 |
| 2001/0045627 A1 | 11/2001 | Connah | |
| 2002/0109211 A1 | 8/2002 | Shinohara | |
| 2002/0113617 A1 | 8/2002 | Gergintschw | |
| 2003/0006434 A1 | 1/2003 | Kawafuji et al. | |
| 2003/0107120 A1 | 6/2003 | Connah | |
| 2004/0135248 A1 | 7/2004 | Takagawa | |
| 2004/0196678 A1 | 10/2004 | Yoshimura | |
| 2004/0227476 A1 | 11/2004 | Guerra | |
| 2004/0227547 A1 | 11/2004 | Shiraishi | |
| 2005/0054186 A1 | 3/2005 | Kim | |
| 2006/0001318 A1 | 1/2006 | Ahmad | |
| 2006/0043545 A1 | 3/2006 | Yea | |
| 2006/0113664 A1 | 6/2006 | Shiraishi | |
| 2006/0240599 A1 | 10/2006 | Amano | |
| 2007/0064370 A1 | 3/2007 | Kajiwara | |
| 2007/0126092 A1* | 6/2007 | San Antonio | H01L 21/561 257/674 |
| 2007/0200537 A1 | 8/2007 | Akiyama | |
| 2007/0216011 A1 | 9/2007 | Otremba | |
| 2007/0228534 A1 | 10/2007 | Uno | |
| 2008/0002445 A1 | 1/2008 | Cho | |
| 2008/0023831 A1 | 1/2008 | Nishimura | |
| 2008/0074068 A1 | 3/2008 | Takeuchi | |
| 2008/0150436 A1 | 6/2008 | Suzuki | |
| 2008/0217662 A1 | 9/2008 | Harnden | |
| 2008/0224323 A1 | 9/2008 | Otremba | |
| 2008/0252372 A1 | 10/2008 | Williams | |
| 2009/0095979 A1 | 4/2009 | Saito | |
| 2009/0212733 A1 | 8/2009 | Hsieh | |
| 2009/0262468 A1 | 10/2009 | Ide | |
| 2009/0321927 A1 | 12/2009 | Nishimura | |
| 2010/0059875 A1 | 3/2010 | Sato | |
| 2010/0127683 A1 | 5/2010 | Uno | |
| 2010/0148590 A1 | 6/2010 | Kojima | |
| 2010/0164419 A1 | 7/2010 | Suh | |
| 2010/0165681 A1 | 7/2010 | Sakano | |
| 2010/0301464 A1 | 12/2010 | Arshad | |
| 2011/0049685 A1* | 3/2011 | Park et al. | 257/660 |
| 2011/0110011 A1 | 5/2011 | Dittfeld | |
| 2011/0169102 A1 | 7/2011 | Uno | |
| 2011/0254143 A1 | 10/2011 | Chen | |
| 2012/0126378 A1* | 5/2012 | San Antonio et al. | 257/659 |
| 2012/0267750 A1 | 10/2012 | Imai et al. | |
| 2012/0273892 A1 | 11/2012 | Uno | |
| 2013/0155745 A1 | 6/2013 | Tanaka | |
| 2014/0131846 A1 | 5/2014 | Shiramizu | |

FOREIGN PATENT DOCUMENTS

| | | |
|---|---|---|
| JP | 2001135765 A | 5/2001 |
| JP | 2004147401 | 5/2004 |
| JP | 2005183463 | 7/2005 |
| JP | 2005183463 A | 7/2005 |
| JP | 2009-27090 | 2/2009 |
| JP | 2011-29262 | 2/2011 |
| JP | 2012-175070 | 9/2012 |
| WO | WO 98/24128 | 6/1998 |

OTHER PUBLICATIONS

U.S. Appl. No. 61/774,484, filed Mar. 7, 2013, Fernando.
U.S. Appl. No. 61/774,506, filed Mar. 7, 2013, Fernando.
U.S. Appl. No. 61/774,535, filed Mar. 7, 2013, Fernando.
U.S. Appl. No. 61/774,541, filed Mar. 7, 2013, Fernando.
U.S. Appl. No. 61/777,341, filed Mar. 12, 2013, Fernando.
U.S. Appl. No. 61/777,753, filed Mar. 12, 2013, Fernando.
U.S. Appl. No. 61/780,069, filed Mar. 13, 2013, Fernando.
U.S. Appl. No. 61/780,417, filed Mar. 13, 2013, Fernando.
U.S. Appl. No. 61/782,460, filed Mar. 14, 2013, Fernando.
U.S. Appl. No. 13/034,519, filed Feb. 24, 2011, Fernando.
U.S. Appl. No. 13/662,244, filed Oct. 26, 2012, Fernando.
U.S. Appl. No. 14/076,467, filed Nov. 11, 2013, Fernando.
U.S. Appl. No. 14/102,275, filed Dec. 10, 2013, Fernando.
U.S. Appl. No. 14/102,316, filed Dec. 10, 2013, Fernando.
U.S. Appl. No. 14/102,379, filed Dec. 10, 2013, Fernando.
U.S. Appl. No. 14/140,285, filed Dec. 24, 2013, Fernando.
U.S. Appl. No. 14/147,464, filed Jan. 3, 2014, Fernando.
U.S. Appl. No. 14/150,469, filed Jan. 8, 2014, Fernando.
U.S. Appl. No. 14/152,640, filed Jan. 10, 2014, Fernando.
U.S. Appl. No. 14/152,723, filed Jan. 10, 2014, Fernando.

* cited by examiner

SEMICONDUCTOR PACKAGES UTILIZING LEADFRAME PANELS WITH GROOVES IN CONNECTING BARS

BACKGROUND

The present application claims the benefit of and priority to provisional application Ser. No. 61/782,460, filed on Mar. 14, 2013, and entitled "Semiconductor Packages Utilizing Leadframe Panels with Grooves in Connecting Bars." The present application is also a continuation-in-part of application Ser. No. 13/662,244 filed on Oct. 26, 2012, and entitled "Compact Wirebonded Power Quad Flat No-Lead (PQFN) Package," which in turn claims priority to application Ser. No. 13/034,519 filed on Feb. 24, 2011, and entitled "Multi-Chip Module (MCM) Power Quad Flat No-Lead (PQFN) Semiconductor Package Utilizing a Leadframe for Electrical Interconnections," which in turn claims priority to provisional application Ser. No. 61/459,527 filed on Dec. 13, 2010, and entitled "Low Cost Leadframe Based High Power Density Full Bridge Power Device." The present application claims the benefit of and priority to all of the above-identified applications. Moreover, the disclosure and contents of all of the above-identified applications are hereby incorporated fully by reference into the present application.

Fabricating a leadframe-based semiconductor package can include utilizing a leadframe panel, which includes several leadframe modules that are connected by bars of the leadframe panel. The leadframe modules are singulated into semiconductor packages by sawing through the bars of the leadframe panel that connect the leadframe modules. Sawing through the bars of the leadframe panel can leave excess conductive material, such as burrs. The excess conductive material may interfere with testing of a semiconductor package by preventing the semiconductor package from properly making contact with test probes. Furthermore, the excess conductive material may result in the shorting of leads of the semiconductor package.

SUMMARY

A semiconductor packages utilizing leadframe panels with grooves in connecting bars, substantially as shown in and/or described in connection with at least one of the figures, and as set forth more completely in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
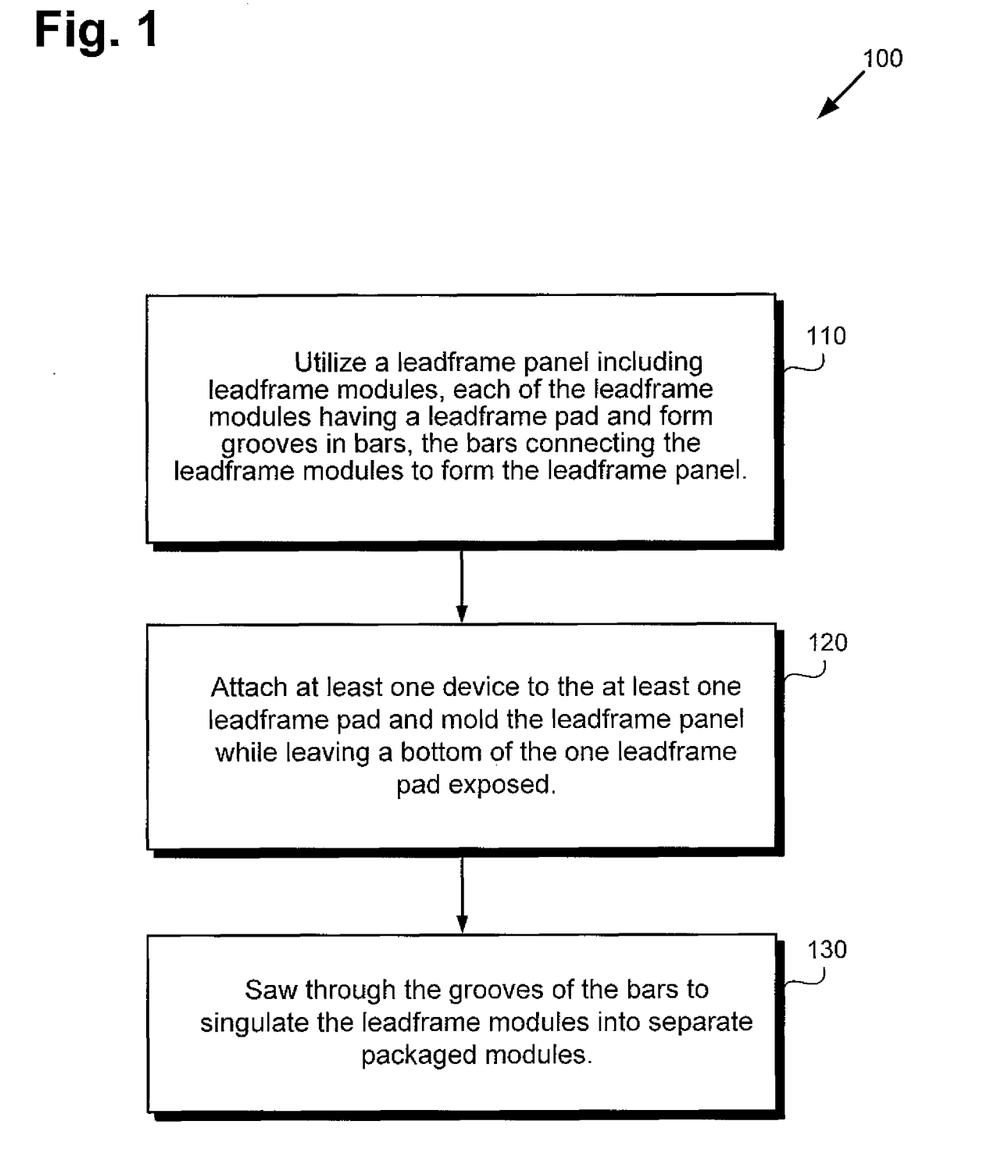
FIG. 1 presents a flowchart illustrating an exemplary method utilizing a leadframe panel.

FIG. 1 presents flowchart 100 illustrating an exemplary method utilizing a leadframe panel. The approach and technique indicated by flowchart 100 are sufficient to describe at least one implementation of the present disclosure, however, other implementations of the disclosure may utilize approaches and techniques different from those shown in flowchart 100. Furthermore, while flowchart 100 is described with respect to FIGS. 2A, 2B, 2C, 2D, 2E, 2F, and 2G, the disclosed inventive concepts are not intended to be limited by specific features shown in FIGS. 2A, 2B, 2C, 2D, 2E, 2F, and 2G.

Referring to flowchart 100 of FIG. 1 and FIGS. 2A, 2B, and 2C flowchart 100 includes utilizing a leadframe panel (e.g. 210) including leadframe modules (e.g. 212), each of the leadframe modules having a leadframe pad (e.g. 218) and forming grooves (e.g. 216) in bars (e.g. 214), the bars connecting the leadframe modules to form the leadframe panel (110 in FIG. 1).

Figure 2A:
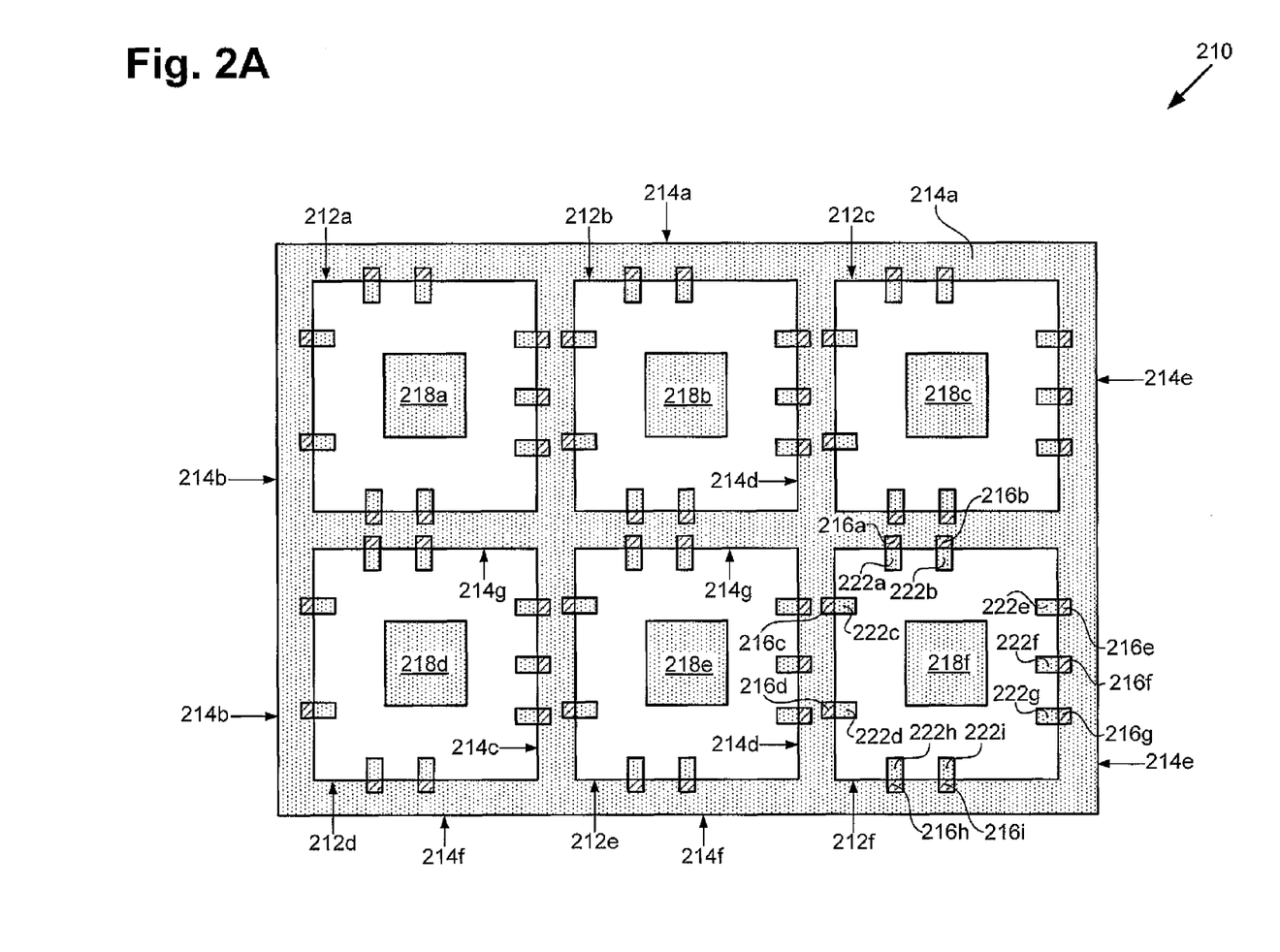
FIG. 2A illustrates a bottom view of an exemplary leadframe panel.
Figure 2B:
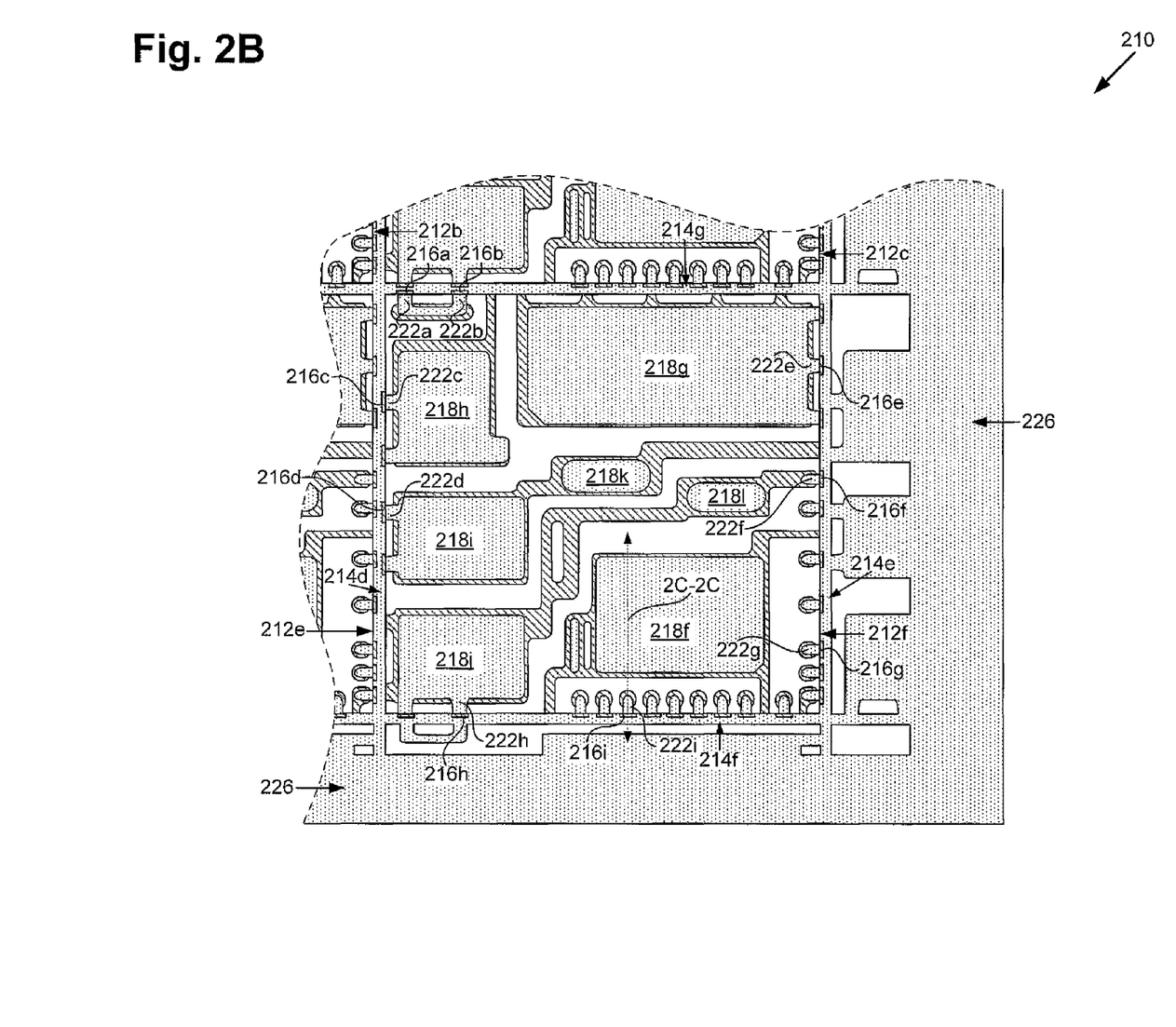
FIG. 2B illustrates a bottom view of an exemplary portion of a leadframe panel.
Figure 2C:
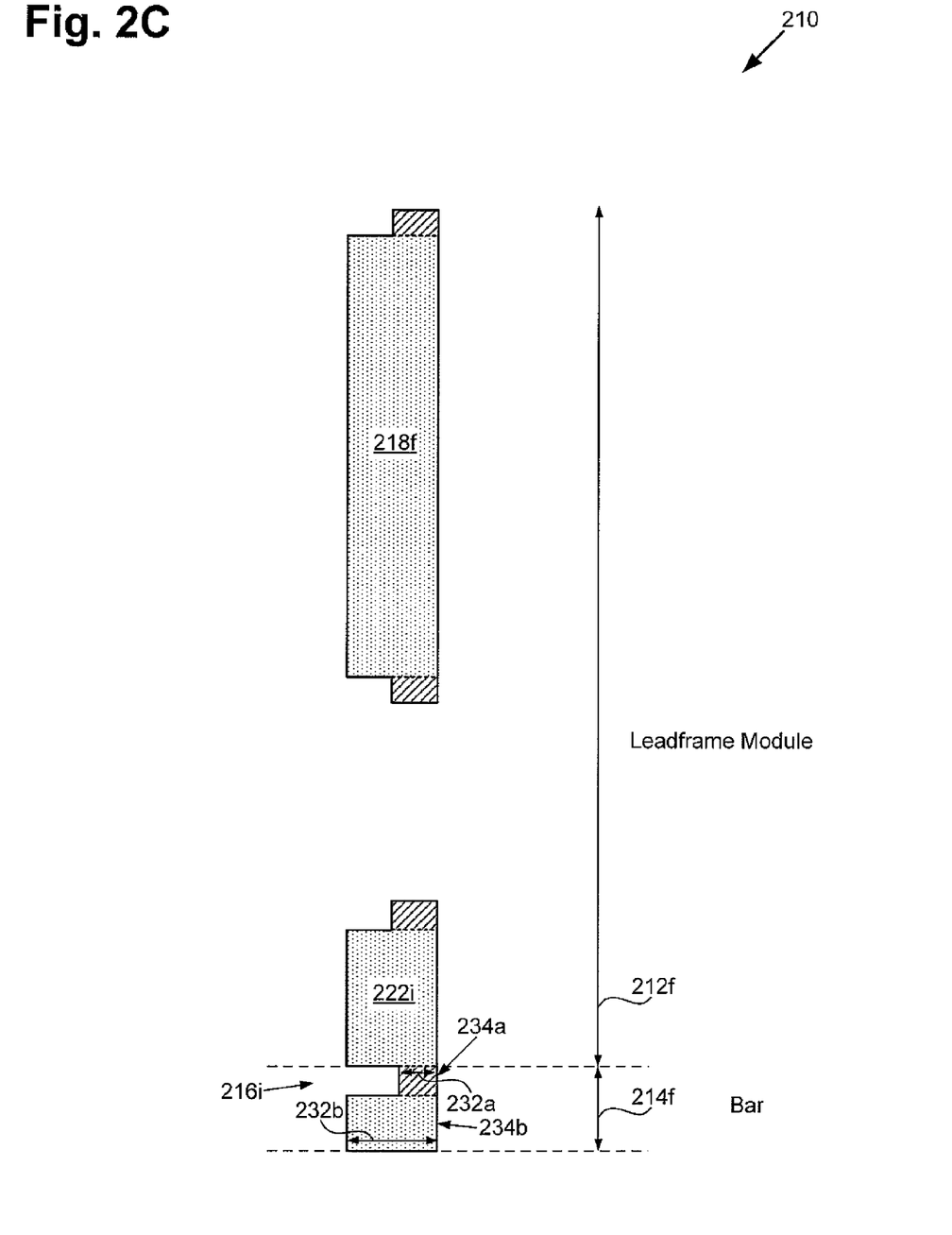
FIG. 2C illustrates a cross-sectional view of an exemplary portion of a leadframe panel.

FIG. 2A illustrates a bottom view of leadframe panel 210. FIG. 2B illustrates a bottom view of a portion of leadframe panel 210. FIG. 2C illustrates a cross-sectional view of a portion of leadframe panel 210. The cross-sectional view in FIG. 2C corresponds to FIG. 2B along line 2C-2C.

Referring to FIG. 2A, leadframe panel 210 includes leadframe modules 212a, 212b, 212c, 212d, 212e, and 212f, which are referred to collectively as "leadframe modules 212." Each of leadframe modules 212 includes at least one leadframe pad, such as leadframe pads 218a, 218b, 218c, 218d, 218e, and 218f, which are collectively referred to as "leadframe pads 218." Each of leadframe modules 212 also includes at least one lead, of which leads 222a, 222b, 222c, 222d, 222e, 222f, 222g, 222h, and 222i (referred to collectively as "leads 222") of leadframe module 212f are individually labeled.

Leadframe panel 210 also includes bars 214a, 214b, 214c, 214d, 214e, and 214f, which are referred to collectively as "bars 214." Each of lead frame bars 214 has a plurality of grooves, of which groves 216a, 216b, 216c, 216d, 216e, 216f, 216g, 216h, and 216i (referred to collectively as "grooves 216") are individually labeled.

In the present implementation, leadframe panel 210 a quad-flat no-leads (QFN) panel, and more particularly is a power QFN (PQFN) panel. However, leadframe panel 210 can be different types of panels. Leadframe panel 210 includes a material or materials with high thermal and electrical conductivity such as copper (Cu) alloy C194 available from Olin Brass®. Portions of leadframe panel 210 can be selectively plated with materials for enhanced adhesion to device dies and wires, which are later attached to leadframe panel 210. The plating can include silver (Ag) plating that is selectively applied to leadframe panel 210, which is available from companies such as QPL Limited.

With respect to flowchart 100, leadframe panel 210 is utilized, which includes leadframe modules 212. Leadframe modules 212 correspond to regions of leadframe panel 210, which are designated for separate packaged modules, such as separate QFN packages (e.g. PQFN packages). As shown in FIG. 2A, leadframe modules 212 are substantially rectangular and are arranged in an array in leadframe panel 210. In various implementations, the array of leadframe modules 212 is an N by M array where N corresponds to the number of rows of leadframe modules 212 and M corresponds to the number of columns of leadframe modules 212 in leadframe panel 210. For example, in the implementation shown, the array is a two by three array. While in FIG. 2A leadframe modules 212 are substantially identical in structure, leadframe modules 212 can have different structures with respect to one another.

As shown in FIG. 2A, each of leadframe modules 212 has at least one leadframe pad, of which leadframe pads 218 are shown in FIG. 2A. FIG. 2B shows a more detailed and specific example of leadframe panel 210, which is not intended to limit the present disclosure. As shown in FIG. 2B, leadframe module 212f includes leadframe pad 218f as well as leadframe pads 218g, 218h, 218i, 218j, 218k, and 218l, which are not shown in FIG. 2A. FIG. 2B also shows frame 226 of leadframe panel 210, which surrounds leadframe modules 212 and is not shown in FIG. 2A.

In FIG. 2A, leadframe panel 210 has bars 214 connecting leadframe modules 212. For example, bars 214d, 214e, 214f, and 214g connect leadframe module 212f in leadframe panel 210. In the present implementation, each of bars 214 adjoins at least one of the leads of leadframe modules 212, such as leads 222. Bars 214 correspond to regions of leadframe panel 210, which are to be removed in singulating leadframe panel 210 into separate packaged modules. Bars 214 can also be referred to as connecting bars or dambars.

With respect to flowchart 100, grooves 216 are formed in bars 214 of leadframe panel 210. Leadframe panel 210 in FIGS. 2A, 2B, and 2C corresponds to a leadframe panel after forming grooves 216 in bars 214. While flowchart 100 includes forming grooves 216 in bars 214, in some implementations grooves 216 are already formed upon entering flowchart 100.

In the present implementation, forming grooves 216 includes etching bars 214. Thus, leadframe panel 210 is an etched leadframe panel, such as a half-etched leadframe. Portions of leadframe panel 210 that are unetched (e.g. not half-etched) are indicated in FIGS. 2A, 2B, and 2C by a dotted shading. Portions of leadframe panel 210 that are etched are indicated in FIGS. 2A, 2B, and 2C by a cross-hatched shading. Thus, in FIG. 2C, for example, bar 214f includes etched portion 234a and unetched portion 234b. Etched portion 234a is of thickness 232a and unetched portion 234b is of thickness 232b. Thus, groove 216i is defined by thickness 232a of bar 214f that is less than thickness 232b of bar 214f. All of grooves 216 are similarly defined by thickness 232a that is less than thickness 232b of bar 214f in the present implementation.

As shown in FIG. 2A, bars 214 are of thickness 232b surrounding each of leadframe modules 212. While leadframe panel 210 is substantially of two thicknesses, more than two thicknesses can be utilized in leadframe panel 210. Also, while grooves 216 are shown as having substantially parallel sidewalls, the sidewalls can take other forms, such as being sloped or curved, as examples. Furthermore, while bottoms of grooves 216 are shown as being flat and are defined by thickness 232a, those bottoms can take other forms, such as being pointed or rounded, as examples.

Each of grooves 216 adjoins one of leadframe modules 212. For example, FIG. 2C shows groove 216i adjoining leadframe module 212f. More particularly, in the present implementation, each of grooves 216 adjoins at least one lead of one of leadframe modules 212. For example, groove 216i adjoins lead 222i of leadframe module 212f. At least one of leadframe pads 218 can be structurally integral and continuous with at least one lead. For example, FIG. 2B shows leadframe pad 218g, which is structurally integral and continuous with lead 222e (and two other leads) and leadframe pad 218j, which is structurally integral and continuous with lead 222h (and one other lead).

In some implementations, forming grooves 216 can include etching bars 214 concurrently with etching at least one of leadframe modules 212. For example, grooves 216 can thereby be formed concurrently with at lead one of leadframe pads 218. In doing so, leadframe modules 212 and bars 214 can both be etched without requiring additional etching processes for forming grooves 216.

After attaching devices to leadframe panel 210, leadframe modules 212 can be singulated into separate packaged modules, by sawing through bars 214 of leadframe panel 210 that connect leadframe modules 212. In doing so, there is a risk of excess conductive material, such as burrs remaining. The excess conductive material may interfere with testing of the separate packaged modules by preventing the separate packaged modules from properly making contact with test probes. Furthermore, the excess conductive material may result in the shorting of leads 222 of the separate packaged modules. By including grooves 216 in bars 214, the incidence of the excess conductive material can be significantly reduced.

Etching into bars 214 can reduce wirebonding stability, which is especially impactful when leadframe modules 212 are large. For example, as leadframe modules 212 are made larger, wirebonding stability is reduced. Thus, etching bars 214 can result in unacceptable wirebonding stability, particularly for larger leadframe modules 212. QFN leadframe modules are typically simple and small and house a single device on a single large leadframe pad. As such, wirebonding stability is typically not a significant issue. However, in some implementations, leadframe modules 212 can be large and complex, an example of which is shown in FIG. 2B, while having acceptable wirebonding stability.

In FIG. 2B, leadframe module 212f is a PQFN leadframe module and has a large footprint of approximately 12 millimeters by approximately 12 millimeters. Furthermore, leadframe pads 218f, 218g, 218h, 218i, and 218j are small and can each include at least one device attached thereto, as will be described further with respect to FIGS. 2D and 2E. By having multiple thicknesses (e.g. thickness 232a and thickness 232b) of bars 214, leadframe panel 210 can maintain acceptable wirebonding stability, even for larger leadframe modules, while utilizing grooves 216 to significantly reduce the incidence of excess conductive material. For example, having thickness 232b (or multiple thicknesses) that is greater than thickness 232a substantially surrounding each of leadframe modules 212 can contribute to maintaining wirebonding stability. Furthermore, including grooves 216 adjoining leads 222 can contribute to maintaining wirebonding stability by, for example, substantially limiting the thinnest portions of leadframe panel 210 to regions immediately adjacent to leads 222.

Figure 2D:
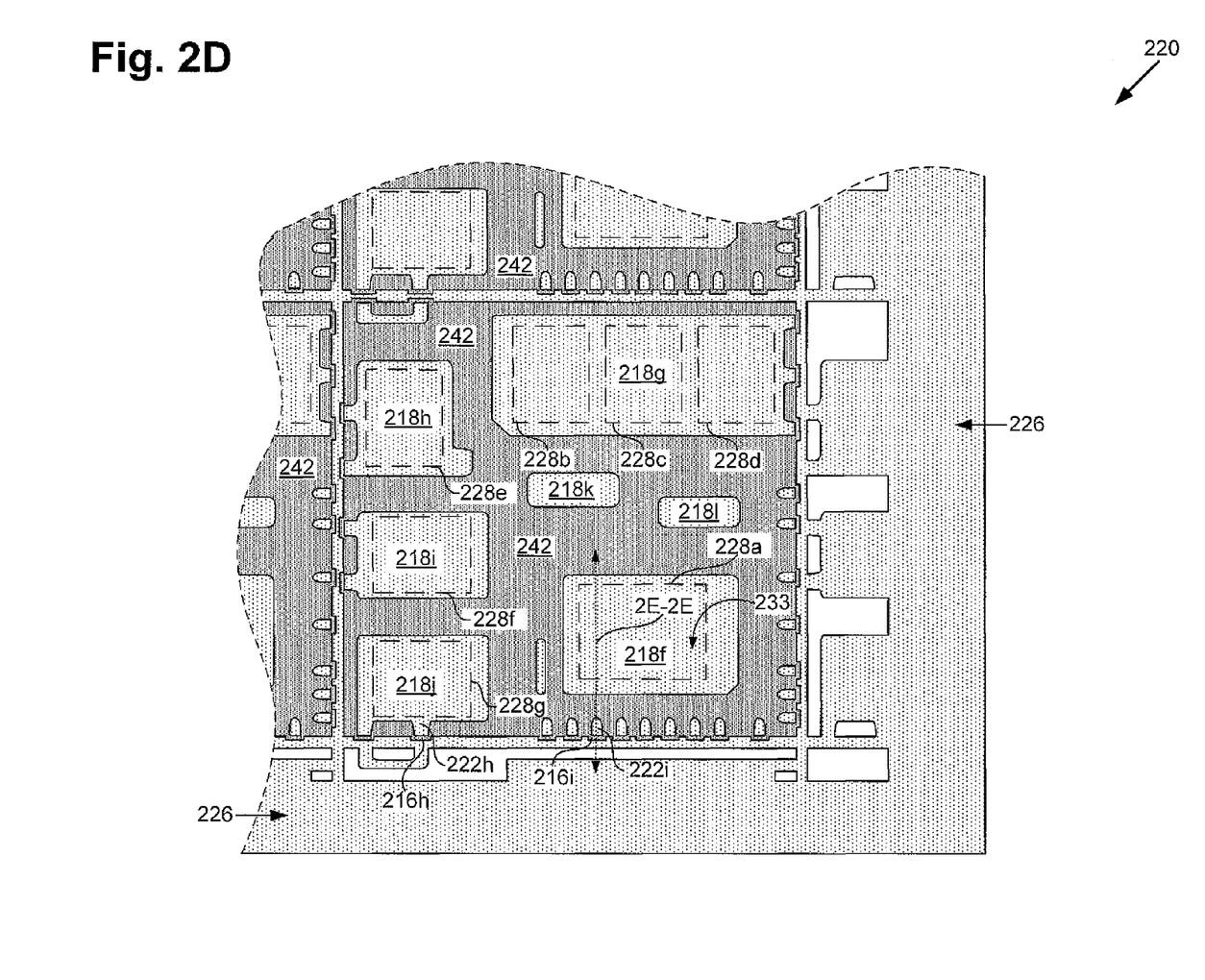
FIG. 2D illustrates a bottom view of an exemplary portion of a leadframe panel.
Figure 2E:
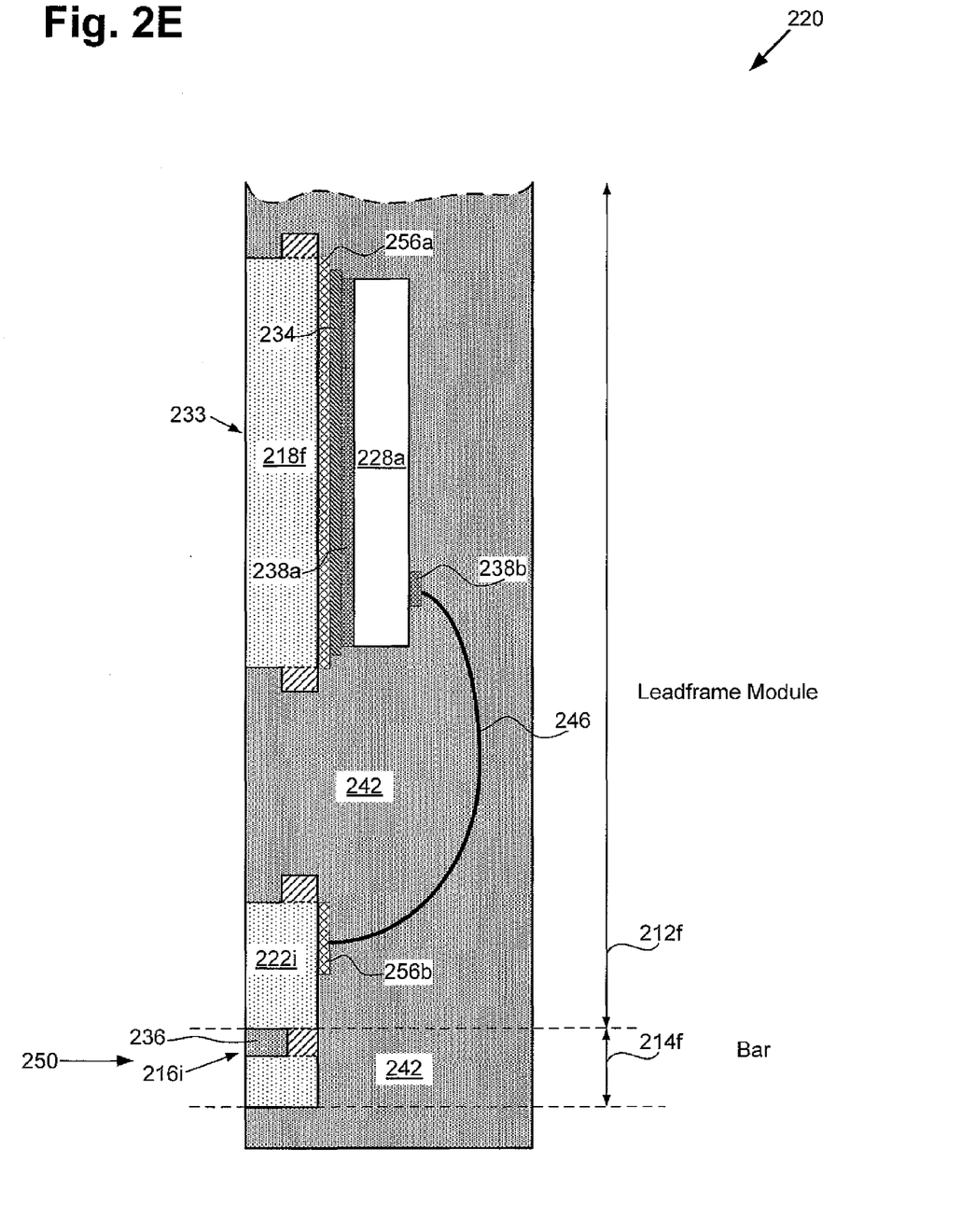
FIG. 2E illustrates a cross-sectional view of an exemplary portion of a leadframe panel.

Referring now to flowchart 100 of FIG. 1 and FIGS. 2D and 2E flowchart 100 includes attaching at least one device (e.g. 228) to the at least one leadframe pad (e.g. 218) and molding the leadframe panel (e.g. 210) while leaving a bottom (e.g. 232) of the one leadframe pad exposed (120 in FIG. 1).

FIG. 2D illustrates a bottom view of a portion of leadframe panel 220. FIG. 2E illustrates a cross-sectional view of a portion of leadframe panel 220. The cross-sectional view in FIG. 2E corresponds to FIG. 2D along line 2E-2E.

Referring to FIG. 2D, leadframe panel 220 includes devices 228a, 228b, 228c, 228d, 228e, 228f, and 228g, which are referred to collectively as "devices 228," and molding material 242. Leadframe panel 220 corresponds to leadframe panel 210 after attaching devices 228 to leadframe panel 210 and molding leadframe panel 210 while leaving bottom 233 of leadframe pads 218 exposed. While only devices 228 are specifically labeled in FIG. 2D, each of leadframe modules 212 includes similar devices in similar configuration so as to produce separate packaged modules that are substantially identical functionally.

With respect to flowchart 100, devices 228 are attached to the leadframe pads 218. Each of devices 228 can comprise, as examples, an integrated circuit (IC), a transistor (e.g. an insulated gate bipolar transistor (IGBT), a metal-oxide-semiconductor field-effect transistor (MOSFET), a high electron mobility transistor (HEMT), a fast-reverse epitaxial diode field effect transistor (FREDFET), etc.), a diode, a capacitor, a resistor, and generally an electrical component. In the present implementation, devices 228b, 228c, 228d, 228e, 228f, and 228g are power transistors and device 228a is a driver IC, which is configured to drive gates of the power transistors via wirebonds. Leadframe module 212f thereby comprises a three phase inverter module where devices 228b, 228c, and 228d are high side power transistors and devices 228e, 228f, and 228g are respective low side power transistors of each phase. However, this is only one specific and non-limiting example of a circuit implemented in accordance with implementations of the present disclosure.

FIG. 2E shows one example of device 228a attached to leadframe pad 218f. Each other device 228 can similarly be attached to corresponding pads. FIG. 2D shows electrode 238a of device 228a attached to leadframe pad 218f via conductive adhesive 254 and plating 256a on leadframe pad 218f. Conductive adhesive 254 can include silver filled adhesive such as QMI 529HT. Plating 256a can include silver (Ag) plating that is selectively applied to leadframe panel 210. Thus, at least one device (e.g. devices 228) can be attached to each of leadframe pads 218. Furthermore, in some implementations, a plurality of devices (e.g. devices 228) can be attached to any of leadframe pads 218. For example, leadframe pad 218g includes devices 228b, 228c, and 228d attached thereto.

After attaching devices 228 to leadframe pads 218, each of devices 228 can be wirebonded to any other one devices 228 and/or leadframe panel 210. For example, FIG. 2E shows one example of device 228a wirebonded to lead 222i. Each other device 228 can similarly be wirebonded in leadframe panel 220. As shown in FIG. 2E, electrode 238b is connected via wirebond 246 to lead 222i of leadframe panel 220 through plating 256b on lead 222i. Wirebonds 246 can be bonded using bond stitch on ball (BSOB) bonding. A specific example of wirebond 246 includes, for example, 1.3 mil diameter G1 type Gold (Au) wires. Thicker wires can be utilized for power connections in leadframe panel 220. For example, the thicker wires can be, 2.0 mil diameter copper (Cu) wires, such as Maxsoft® LD wires available from Kulicke & Soffa®. Furthermore, multiple wirebonds may be utilized for additional current handling capability.

With respect to flowchart 100, leadframe panel 220 is molded while leaving bottom 233 of leadframe pad 218f exposed. As shown in FIG. 2D, bottoms of each of leadframe pads 218 are exposed. The molding leadframe panel 220 results in molding material 242 encapsulating devices 228 and any wirebonds. As shown in FIG. 2D, molding material 242 covers etched portions of leadframe panel 220. However, unetched portions of leadframe panel 220 are exposed through molding material 242. Thus, the bottoms of devices 228 will be available for electrical connection to any of devices 228 and/or thermal dissipation to a printed circuit board (PCB). Molding material 242 can be, for example, a plastic that has a low flexural modulus, such as CEL9218ZHF10 (v79) available from Hitachi® Chemical. In the implementation shown in FIGS. 2D and 2E, molding leadframe panel 220 also results in molding material 242 being situated in and filling grooves 216, thereby providing additional structural support for leads 222 during sawing, amongst other advantages.

Figure 2F:
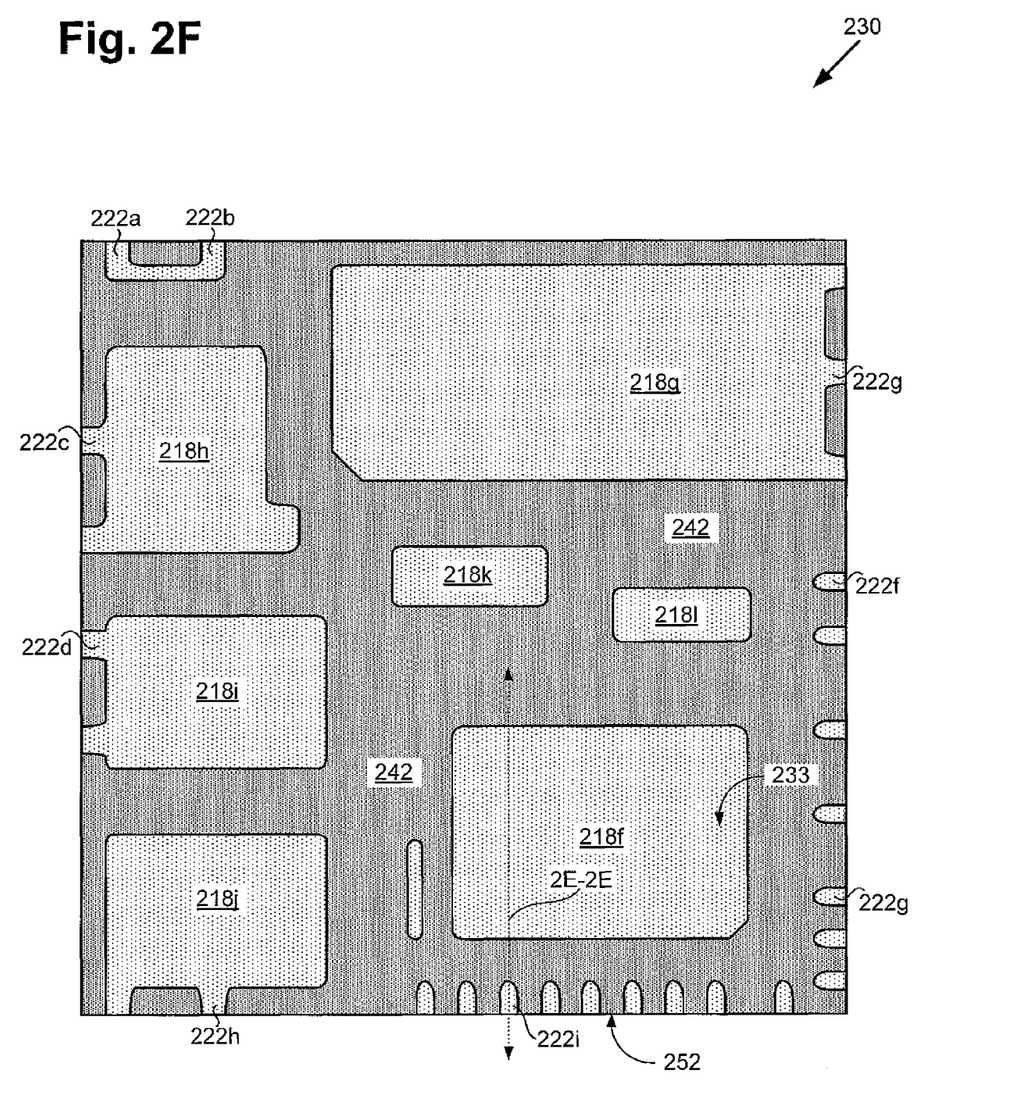
FIG. 2F illustrates a bottom view of an exemplary separate packaged module.
Figure 2G:
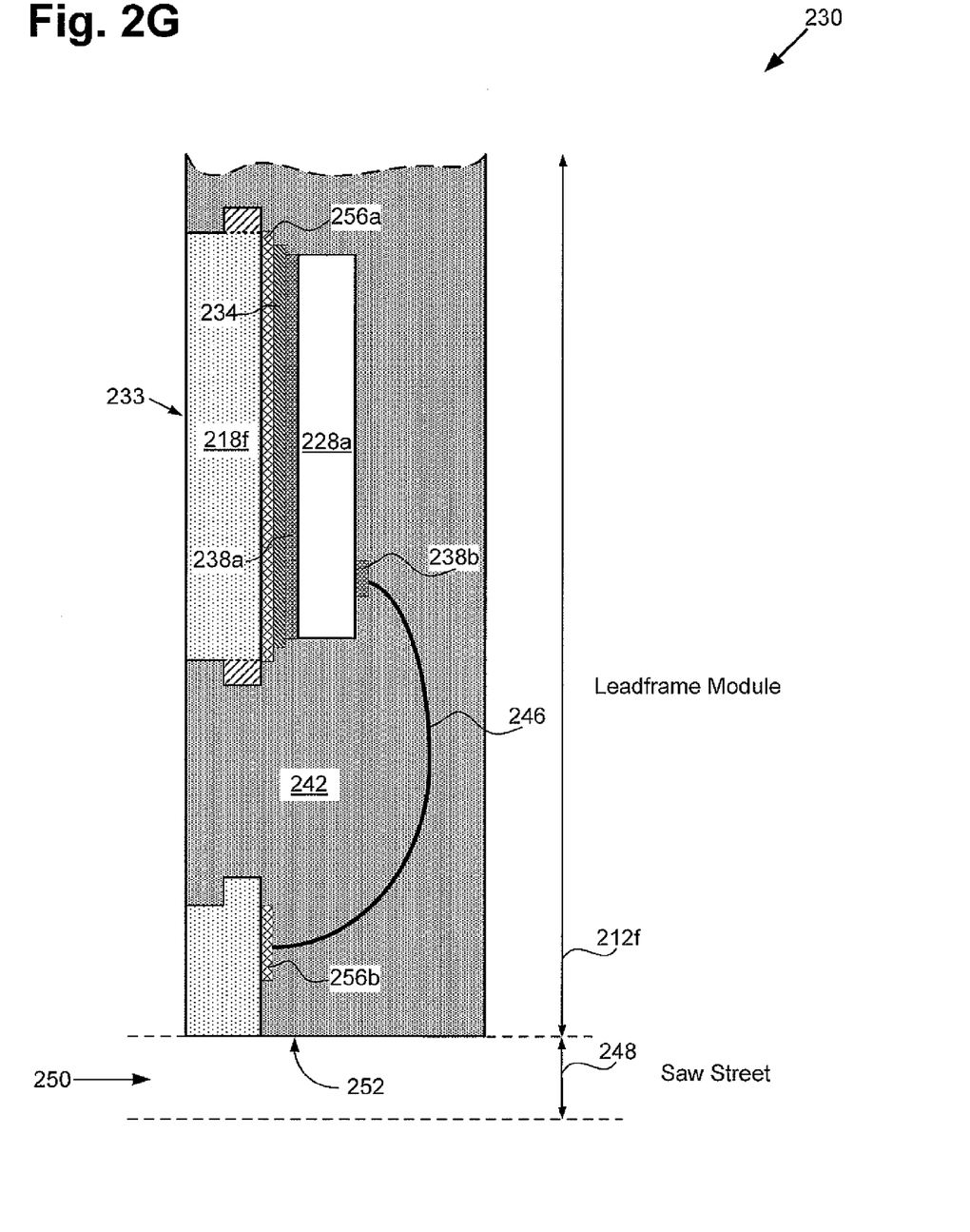
FIG. 2G illustrates a cross-sectional view of an exemplary portion of a separate packaged module.

Referring now to flowchart 100 of FIG. 1 and FIGS. 2F and 2G, flowchart 100 includes sawing through the grooves (e.g. 216) of the bars (e.g. 214) to singulate the leadframe modules into separate packaged modules (e.g. 230) (130 in FIG. 1).

FIG. 2F illustrates a bottom view of separate packaged module 230. FIG. 2G illustrates a cross-sectional view of a portion of separate packaged module 230. The cross-sectional view in FIG. 2G corresponds to FIG. 2F along line 2G-2G.

With respect to flowchart 100, grooves 216 of bars 214 are sawed through to singulate leadframe modules 212 into separate packaged modules, such as separate packaged module 230. As shown in FIG. 2F, the sawing can be performed using saw street 248, which is approximately equal in width to bars 214. The sawing can be into bottom 250 of leadframe panel 220, as indicated in FIGS. 2E and 2G. Thus, edge 252, and other edges in the separated packaged modules can be substantially defined regions in which grooves 216 of bars 214 adjoin leadframe modules 212. In doing so, the risk of excess conductive material, such as burrs remaining after sawing leadframe panel 220 is substantially reduced. The resultant separate packaged module 230 is a PQFN packaged module, however it will be appreciated that various aspects of the present disclosure are not limited to PQFN packaged modules, or more generally QFN packaged modules.

Thus, as described above with respect to FIGS. 1 and 2A-2G, in accordance with various implementations, leadframe panels include grooves, which can allow for a reduction to the risk of excess conductive material, such as burrs remaining after sawing, while still maintaining acceptable wirebonding stability.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method comprising:
utilizing a leadframe panel comprising a plurality of leadframe modules, each of said plurality of leadframe modules having a leadframe pad;
said leadframe panel having a plurality of bars each having a plurality of grooves, said plurality of bars connecting said plurality of leadframe modules;
attaching a device to said leadframe pad;
molding said leadframe panel while leaving a bottom of said leadframe pad exposed;
sawing through said plurality of grooves of said plurality of bars to singulate said plurality of leadframe modules into separate packaged modules, wherein each of said plurality of grooves is entirely discarded from each of said plurality of leadframe modules.

2. The method of claim 1, wherein each of said plurality of grooves adjoins one of said plurality of leadframe modules.

3. The method of claim 1, wherein each of said plurality of grooves adjoins a lead of one of said plurality of leadframe modules.

4. The method of claim 3, wherein said leadframe pad is structurally integral and continuous with said lead.

5. The method of claim 1, wherein said attaching said device to said leadframe pad comprises attaching a plurality of devices to said leadframe pad.

6. The method of claim 1, wherein said leadframe pad is of a plurality of leadframe pads and said attaching comprises attaching at least one device to each of said plurality of leadframe pads.

7. The method of claim 1, wherein said molding said leadframe panel results in molding material being situated in said plurality of grooves.

8. The method of claim 1, wherein said leadframe panel is a quad-flat no-leads (QFN) panel.

9. The method of claim 1, wherein said plurality of grooves are defined by a first thickness of said plurality of bars that is less than a second thickness of said plurality of bars.

10. A method comprising:
utilizing a leadframe panel comprising a plurality of leadframe modules, each of said plurality of leadframe modules having a leadframe pad;
forming a plurality of grooves in a plurality of bars, said plurality of bars connecting said plurality of leadframe modules to form said leadframe panel;
sawing through said plurality of grooves of said plurality of bars to singulate said plurality of leadframe modules into separate packaged modules, wherein each of said plurality of grooves is entirely discarded from each of said plurality of leadframe modules.

11. The method of claim 10, wherein each of said plurality of grooves adjoins one of said plurality of leadframe modules.

12. The method of claim 10, wherein each of said plurality of grooves adjoins a lead of one of said plurality of leadframe modules.

13. The method of claim 10, wherein said forming said plurality of grooves includes etching said plurality of bars.

14. The method of claim 10, wherein said forming said plurality of grooves includes etching said plurality of bars concurrently with etching said plurality of leadframe modules.

15. The method of claim 10 comprising molding, prior to the sawing, said leadframe panel while leaving a bottom of said leadframe pad exposed.

16. The method of claim 15, wherein said molding said leadframe panel results in molding material being situated in said plurality of grooves.

17. The method of claim 10, wherein said plurality of grooves are defined by a first thickness of said plurality of bars that is less than a second thickness of said plurality of bars.

18. The method of claim 17, wherein said plurality of bars are of said first thickness surrounding each of said leadframe modules.

19. The method of claim 10, comprising attaching a device to said leadframe pad.

* * * * *